(12) United States Patent
Ito et al.

(10) Patent No.: US 7,274,140 B2
(45) Date of Patent: *Sep. 25, 2007

(54) ORGANIC EL DISPLAY DEVICE

(75) Inventors: Masato Ito, Mobara (JP); Akiko Yasukawa, Kokubunji (JP)

(73) Assignee: Hitachi Displays, Ltd., Mobara-Shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/494,713

(22) Filed: Jul. 28, 2006

(65) Prior Publication Data

US 2006/0261729 A1    Nov. 23, 2006

Related U.S. Application Data

(63) Continuation of application No. 10/804,102, filed on Mar. 19, 2004, now Pat. No. 7,091,658.

(30) Foreign Application Priority Data

Mar. 20, 2003 (JP) .............................. 2003-078112

(51) Int. Cl.
*H01J 1/62* (2006.01)
(52) U.S. Cl. ...................................... 313/504; 313/506
(58) Field of Classification Search ................ 313/498, 313/504–506
See application file for complete search history.

*Primary Examiner*—Vip Patel
(74) *Attorney, Agent, or Firm*—Antonelli, Terry, Stout & Kraus, LLP.

(57) ABSTRACT

In an organic EL display device having at least one electrode, a light emitting material layer and another electrode that are stacked in each pixel region formed on a surface of a substrate, wherein the light emitting material layer is formed in an opening portion of a bank film which separates the pixel region from other pixel regions arranged close to the pixel region so that the inside of the opening portion of the bank film is filled with the light emitting material layer, a light reflection function is imparted to at least a side wall surface of the opening portion of the bank film, so that the light take-out efficiency of the organic EL display device is enhanced.

4 Claims, 2 Drawing Sheets

ORGANIC EL DISPLAY DEVICE

CROSS-REFERENCE TO RELATED APPLICATION

This application is a continuation of U.S. application Ser. No. 10/804,102, filed Mar. 19, 2004 now U.S. Pat. No. 7,091,658; said application also claims priority from Japanese application JP2003-078112, filed on Mar. 20, 2003, the entire contents of both are hereby incorporated by reference into this application.

BACKGROUND OF THE INVENTION

The present invention relates to an organic EL display device, and, more particularly, to an organic EL display device in which each pixel region is partitioned by a bank film from other pixel regions that are arranged close to the pixel region.

For example, an active-matrix type organic EL display device includes, on a surface of a substrate thereof, gate signal lines, which extend in the x direction and are arranged in parallel in the y direction, and drain signal lines, which extend in the y direction and are arranged in parallel in the x direction, wherein rectangular regions which are bounded by these signal lines define pixel regions. Each pixel region includes a switching element, which is turned on in response to a scanning signal received from the one gate signal line, and a pixel electrode to which a video signal is supplied from the one drain signal line through the switching element. Here, a counter electrode is stacked over an upper surface of the pixel electrode by way of a light emitting material layer. A signal which becomes a reference with respect to the video signal is supplied to the counter electrode. A current is made to flow into the light emitting material layer through the above-mentioned respective electrodes, and the light emitting material layer emits light in response to this current. The emission of light is visible through one electrode (the light transmitting conductive film) of the above-mentioned respective electrodes.

Here, although the above-mentioned signal lines and electrodes are formed by selective etching using photolithography, the light emitting material layer is usually formed using a so-called vacuum evaporation shadow mask. This is because, when the light emitting material layer contains moisture or the like, the light emitting material layer is easily degenerated.

Further, the light emitting material layer is in a liquid state when it is applied to the substrate, and, hence, a bank film made of resin, for example, is preliminarily formed for partitioning each pixel region from other pixel regions arranged close to the pixel, and the light emitting material layer is filled in the inside of an opening portion formed in the bank film (see the following patent literature 1).

[Patent Literature 1]
Japanese Unexamined Patent Publication 2000-176660.

SUMMARY OF THE INVENTION

In an organic EL display device having such a constitution, an enhancement of the light take-out efficiency is strongly desired along with miniaturization of the pixel regions. However, as described above, when the bank film which partitions the respective pixel regions is formed, a portion of the light from the light emitting material layer enters the inside of the bank film, and this light is not effectively used for enhancement of the luminance of the pixels.

The present invention has been made in view of such circumstances, and it is an object of the present invention to provide an organic EL display device which exhibits a favorable light take-out efficiency.

A summary of representative Examples of the invention disclosed in the present application is as follows.

EXAMPLE 1

An organic EL display device according to the present invention is characterized in that, at least one electrode, a light emitting material layer and another electrode are stacked on each pixel region formed on a surface of a substrate, the light emitting material layer is formed in a state such that the light emitting material layer is filled in the inside of an opening portion formed in a bank film which partitions the pixel region and other pixel regions which are arranged close to the pixel region, and a light reflection function is imparted to at least a side wall surface of the opening portion of the bank film.

EXAMPLE 2

An organic EL display device according to the present invention is characterized in that, at least one electrode, a light emitting material layer and another electrode are stacked on each pixel region formed on a surface of a substrate, the light emitting material layer is formed in a state such that the light emitting material layer is filled in the inside of an opening portion formed in a bank film which partitions the pixel region and other pixel regions arranged close to the pixel region, and a material layer having an optical refractive index which differs from the optical refractive index of the material of the bank film is formed on at least a side wall surface of the opening portion of the bank film.

EXAMPLE 3

An organic EL display device according the present invention is characterized in that, on the premise of constitution of the Example 2, the material layer having an optical refractive index which differs from the optical refractive index of the material of the bank film has the optical refractive index thereof set larger than the optical refractive index of the bank film.

EXAMPLE 4

An organic EL display device according to the present invention is characterized in that, at least one electrode, a light emitting material layer and another electrode are stacked on each pixel region formed on a surface of a substrate, the light emitting material layer is formed in a state such that the light emitting material layer is filled in the inside of an opening portion formed in a bank film which partitions the pixel region and other pixel regions arranged close to the pixel region, and a light reflection function is imparted to at least a side wall surface of the opening portion of the bank film and a pigment which decreases the optical transmissivity of the bank film per se is contained in the bank film.

EXAMPLE 5

An organic EL display device according to the present invention is characterized in that, on the premise of the constitution of the Example 1, a metal oxide film is applied to at least the side wall surface of the opening portion of the bank film by coating.

The present invention is not limited to the above-mentioned constitutions, and various modifications are conceivable without departing from the technical concept of the present invention.

DETAILED DESCRIPTION

Hereinafter, various embodiments of a liquid crystal display device according to the present invention will be explained in conjunction with drawings.

Embodiment 1

<<Equivalent Circuit of Display Portion>>

Figure 2:
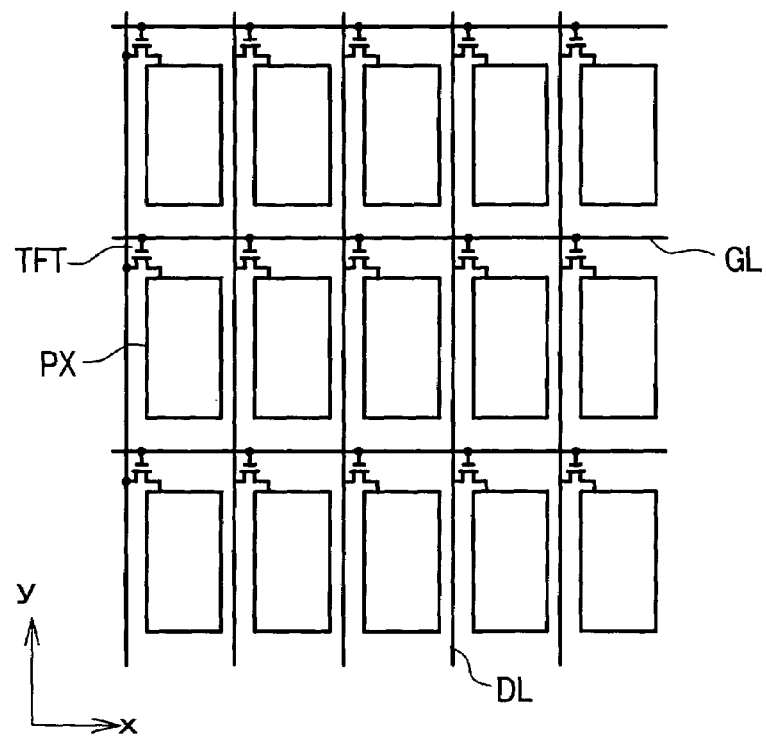
FIG. 2 is an equivalent circuit diagram showing one embodiment of a display part of the organic EL display device according to the present invention.

FIG. 2 is an equivalent circuit diagram showing one embodiment of a display region of an organic EL display device according to the present invention.

In the display region, first of all, gate signal lines GL extend in the x direction and are arranged in parallel in the y direction, as seen in the drawing, and, further, drain signal lines DL extend in the y direction and are arranged in parallel in the x direction, as seen in the drawing. Rectangular regions which are bounded by these gate signal lines GL and drain signal lines DL constitute pixel regions, and an array of these pixel regions constitute the display region.

Each pixel region includes a thin film transistor TFT, which is turned on in response to a scanning signal from the gate signal line GL at one side (upper side in the drawing), and a pixel electrode PX to which a video signal is supplied from the drain signal line DL at one side (left side in the drawing) through the thin film transistor TFT. The pixel electrode PX is configured to sandwich a light emitting material layer together with a counter electrode (not shown in the drawing), and light is emitted from the light emitting material layer in response to an electric current which is made to flow between the pixel electrode PX and the counter electrode. Here, a counter electrode is formed in common with the respective pixel regions, and a signal which becomes a reference with respect to the video signal is supplied to the counter electrode.

Due to such a constitution, the liquid crystal display device is driven such that the respective gate signal lines GL are sequentially selected one after another in response to supply of the scanning signal, while the video signal is supplied to the respective drain signal lines DL one after another at the timing of selection of the gate signal lines GL.

<<Constitution of Pixel>>

Figure 3:
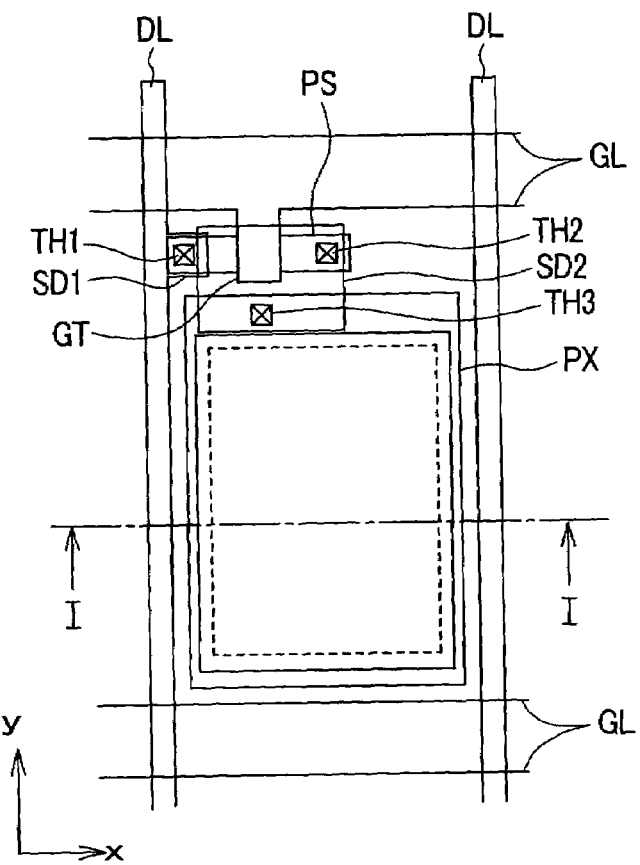
FIG. 3 is a diagrammatic plan view showing one embodiment of a pixel of the organic EL display device according to the present invention.

FIG. 3 is a plan view showing one embodiment of the above-mentioned pixel region. Further, a cross section taken along a line I-I in FIG. 3 is shown in FIG. 1.

In FIG. 3, at a left upper portion of each pixel region formed on a surface of the substrate SUB1, made of glass (see FIG. 1), for example, a semiconductor layer PS formed of a polysilicon layer, which extends in the x direction in the drawing, is formed. The semiconductor layer PS constitutes a semiconductor layer of the thin film transistor TFT.

Figure 1:
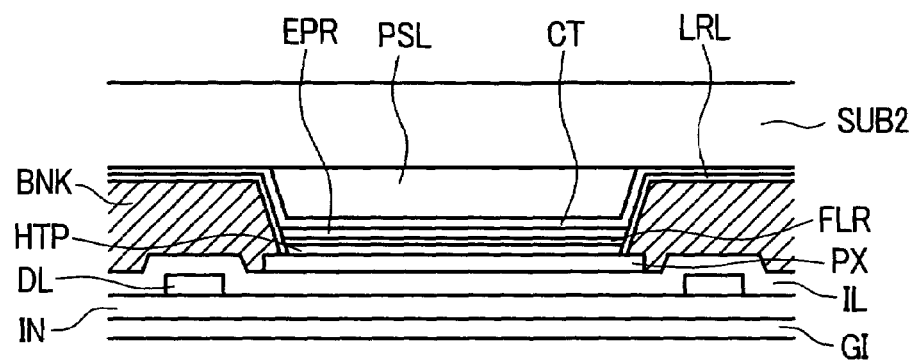
FIG. 1 is a diagrammatic cross-sectional view taken along line I-I in FIG. 3, showing one embodiment of an organic EL display device according to the present invention.

Then, on the surface of the substrate SUB1, an insulating film GI is formed such that the insulating film GI covers also the semiconductor layers PS (see FIG. 1). The insulating film G1 functions as gate insulating films in regions where the thin film transistors TFT are formed.

On a surface of the insulating film GI, the gate signal lines GL which extend in the x direction and are arranged in parallel in the y direction are formed. The gate signal lines GL are configured to define the pixel regions together with drain signal lines DL to be described later.

Further, the gate signal line GL has a portion thereof which constitutes an extension portion which extends so as to traverse a substantially center portion of the semiconductor layer PS, and this extension portion functions as a gate electrode GT of the thin film transistor TFT. After the formation of the gate electrode GT, impurities ions are implanted using the gate electrode GT as a mask so as to cause portions of the semiconductor layer PS, other than a portion of the semiconductor layer PS right below the gate electrode GT, to have a low resistance.

On the surface of the substrate SUB1, an insulating film IN (see FIG. 1) is formed such that the insulating film IN also covers the gate signal lines GL (gate electrodes GT). The insulating film IN functions as an interlayer insulating film with respect to the gate signal lines GL in regions where the drain signal lines DL. On a surface of the insulating film IN, the drain signal lines DL, which extend in the y direction and are arranged in parallel in the x direction, are formed. A portion of the drain signal line DL extends to an end portion of the semiconductor layer PS and is connected to the semiconductor layer PS via a through hole TH1, which is preliminarily formed in the insulating film IN and the insulating film GI in a penetrating manner. That is, the extension portion of the drain signal line DL functions as a drain electrode SD1 of the thin film transistor TFT.

Further, on another end portion of the semiconductor layer PS, a source electrode SD2 is formed so as to be connected to the semiconductor layer PS via a through hole TH2, which is preliminarily formed in the insulating film IN and the insulating film GI in a penetrating manner. An extension portion which is caused for connecting the source electrode SD2 to the pixel electrode PX is formed on the source electrode SD2.

On the surface of the substrate SUB1 on which the drain signal lines DL (drain electrodes SD1) and the source electrodes SD2 are formed, an insulating film IL (see FIG. 1) is formed. On an upper surface of the insulating film IL, a pixel (anode) electrode PX is formed at the center of each pixel region, except for a minute periphery of the pixel region PX, and the pixel electrode PX is connected to the source electrode SD2 of the thin film transistor TFT via a through hole TH3 formed in the insulating film IL. Here, the pixel electrode PX is formed of a light transmitting conductive film, such as ITO (Indium Tin Oxide), for example, for allowing light from a light emitting material layer FLR to pass therethrough to the substrate SUB1 side.

On an upper surface of the pixel electrode PX, a light emitting material layer FLR is stacked by way of a hole-transporting layer HTP, and an electron injection layer EPR is stacked on the hole-transporting layer HTP. These respective layers, including the light emitting material layer FLR, are formed in a state such that these layers are partitioned from the light emitting material layer and the like in other neighboring pixel regions by a bank (partition wall) film BNK that is made of an organic material layer. Here, the bank film BNK is formed after forming the pixel electrodes PX, for example, and it is formed such that a resin film or the like, for example, is applied to the whole area of the upper surface of the transparent substrate SUB1 by coating; and, thereafter, openings which expose major portions of the centers of the pixel electrodes PX, except for peripheries of the pixel electrodes PX, are formed in the resin film or the like.

Further, with respect to the bank film BNK, on a surface thereof and on the surfaces of the side walls of the above-mentioned openings, a light reflection film LRL, which is made of a material different from the material of the bank film BNK and has a relatively small film thickness, is formed. The light reflection film LRL may be formed to produce reflection of light on an interface with the bank film BNK by selecting a material which, per se, does not have a light reflection function and has a refractive index $n_2$ which is smaller than the refractive index $n_1$ of the material of the bank film BNK, or a material which, per se, has a light reflection function.

In the former case, for example, an acrylic resin ($n_1$=1.49 to 1.50) may be used as the material of the bank film BNK, while polyimide ($n_2$=1.52 to 1.54), polystyrene ($n_2$=1.59 to 1.50), polycarbonate resin ($n_2$=1.58 to 1.59), phenol resin ($n_2$=1.58 to 1.66) or epoxy resin ($n_2$=1.55 to 1.61) may be used as the material of the light reflection film LRL.

Further, methacrylic resin ($n_1$=1.49) may be used as the material of the bank film BNK, while polyimide ($n_2$=1.52 to 1.54), polystyrene ($n_2$=1.59 to 1.50), polycarbonate resin ($n_2$=1.58 to 1.59), phenol resin ($n_2$=1.58 to 1.66) or epoxy resin ($n_2$=1.55 to 1.61) may be used as the material of the light reflection film LRL.

Further, low refractive polyimide may be used as the material of the bank film BNK, while a high refractive polyimide may be used as the material of the light reflection film LRL.

Further, fluororesin ($n_1$=1.35) may be used as the material of the bank film BNK, while polyimide ($n_2$=1.52 to 1.54), polystyrene ($n_2$=1.59 to 1.50), polycarbonate resin ($n_2$=1.58 to 1.59), phenol resin ($n_2$=1.58 to 1.66) or epoxy resin ($n_2$=1.55 to 1.61) may be used as the material of the light reflection film LRL.

Further, silicon resin ($n_1$=1.43) may be used as the material of the bank film BNK, while polyimide ($n_2$=1.52 to 1.54), polystyrene ($n_2$=1.59 to 1.50), polycarbonate resin ($n_2$=1.58 to 1.59) or phenol resin ($n_2$=1.58 to 1.66) may be used as the material of the light reflection film LRL.

Further, resin having a refractive index of less than 1.5 may be used as the material of the bank film BNK, while a resin having a refractive index of equal to or more than 1.5 may be used as the material of the light reflection film LRL.

Further, a silicon oxide film ($n_1$=1.46) may be used as the bank film BNK, while a resin having a refractive index of equal to or more than 1.5, or silicon nitride, may be used as the material of the light reflection film LRL.

Further, in the latter case, a silicon oxide film ($n_1$=1.46) may be used as the bank film BNK, while a metal oxide ($Al_2O_3$, $MgO$, $HfO_2$, $ZrO_2$, $Cr_2O_3$, $TiO$, $Ta_2O_5$, $CaO$, $BaO$) may be used as the material of the light reflection film LRL.

Further, in the latter case, a silicon nitride may be used as the material of the bank film BNK, while a metal oxide ($Al_2O_3$, $MgO$, $HfO_2$, $ZrO_2$, $Cr_2O_3$, $TiO$, $Ta_2O_5$, $CaO$, $BaO$) may be used as the material of the light reflection film LRL.

Here, as the acrylic resin, OPTMERRPC series (Heat resistant transparent photoresist) (a product of JSR Corporation, (Tokyo, Japan)), a resist material of Tokyo Ohka Kogyo Co., Ltd. (Tokyo, Japan) or the like may be used. As the polyimide resin, OPI-N-series (a product of Hitachi Chemical Co., Ltd, Tokyo, Japan), PHOTONEECER series (photosensitive polyimide coatings) (a product of Toray Industries, Inc. (Tokyo, Japan) or the like may be used. As the phenol resin, WIX-2 (a product of Nihon Zeon Co., Ltd (Tokyo Japan)), a positive photoresist (a product of JSR Corporation or Tokyo Ohka Kogyo Co., Ltd. (Tokyo, Japan) or the like may be used. As the fluoric resin, a fluoric resin resist or the like may be used. As the low refractive polyimide, OPTOREZR (Low Birefringent Polymer Series) (a product of Hitachi Chemical Co., Ltd, Tokyo, Japan) or the like may be used. As the high refractive polyimide, OPI-N-series (a product of Hitachi Chemical Co., Ltd, Tokyo, Japan) or the like may be used.

On upper surfaces of the electron injection layer EPR and the bank film BNK, a common (cathode) electrode CT, which is provided in common with respective pixel regions, is formed. The substrate SUB2, which is made of glass, for example, is laminated to an upper surface of the counter electrode CT by way of a high molecular resin seal PSL.

By supplying an electric current to the light emitting material layer FLR, which is interposed between the pixel electrode PX and the counter electrode CT, the light emitting material layer FLR emits light and the light LT can be observed through the pixel electrode PX and the substrate SUB1. Here, the voltage signal which becomes a reference with respect to the video signal is applied to the counter electrode CT and the video signal is applied to the pixel electrode PX from the drain signal line DL through the thin film transistor TFT. Further, the thin film transistor TFT is switched on in response to the scanning signal from the gate signal line GL.

<<Advantageous Effects>>

According to the above-mentioned organic EL display device, since the light reflection function is applied to the side wall surfaces of the opening portions formed in the bank film BNK, when the light from the light emitting material layers FLR is irradiated through the opening portions, even when some light may be incident on the side-wall-surface side, most of the light is reflected on the side wall surfaces, and the reflected light can arrive at the viewer side in the same manner as other light.

In view of the above, the light from the light emitting material layer FLR is irradiated to the viewer side without wasting light, whereby the take-out efficiency of light can be enhanced.

Further, for the above-mentioned reason, even when there exists light which is incident of the bank film BNK, the amount of such light is small, and, hence, there is no possibility that the light which passes through the bank film BNK reaches other neighboring pixel regions. That is, it is possible to obviate the drawback that the irradiation quantity of light corresponding to the video signal in each pixel is changed by the light from a neighboring pixel which passes through the bank film BNK, whereby the color purities of each pixel can be enhanced.

Embodiment 2

Figure 4:
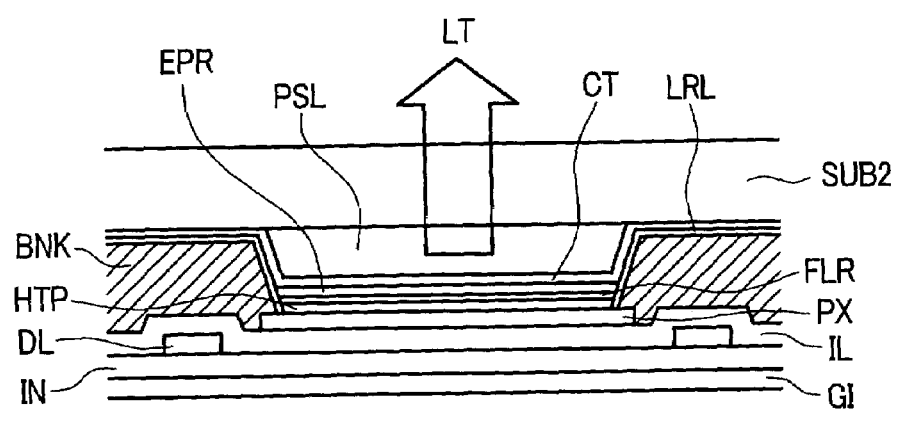
FIG. 4 is a diagrammatic cross-sectional view showing another embodiment of the organic EL display device according to the present invention.

FIG. 4 is a constitutional view showing another embodiment of the pixel of the organic EL display device according to the present invention and corresponds to FIG. 1.

In the case shown in FIG. 1, the organic EL display device is configured such that the light from the light emitting material layer FLR is taken out from the pixel electrodes PX and the substrate SUB1 side. However, the organic EL display device shown in FIG. 4 is configured such that the light from the light emitting material layer FLR is taken out from the counter electrode CT and the substrate SUB2 side. Accordingly, in the case shown in FIG. 4, at least the counter electrode CT is formed of a light transmitting conductive film, such as ITO (Indium Tin Oxide), for example, and the substrate SUB2 is constituted of a transparent substrate made of glass or the like.

Also, in this case, with respect to the bank film BNK which partitions the light emitting material layers FLR or the like, light reflection films LRL, similar to the light reflection films indicated in the embodiment 2, are formed on the surface of the bank film BNK and the side wall surfaces of the opening portions, wherein the light reflection films LRL, per se, have a light reflection function, or have a light reflection function together with the bank film BNK.

Embodiment 3

In the above-mentioned embodiment, as the material of the bank film BNK, the materials which are introduced in the embodiment 1, for example, may be selected. However, it is needless to say that these materials may contain a pigment which positively reduces the optical transmissivity, for example, a black pigment or the like.

In this case, even when the light from the light emitting material layer FLR may be slightly incident on the bank film BNK, the light is absorbed in the bank film BNK, and it is possible to completely eliminate the possibility that the light reaches another pixel region which is arranged close to the pixel region. This is because that there is no possibility that the emission quantity of light corresponding to the video signal in each pixel is influenced by light from the pixel through the bank film BNK, and, hence, the color purity of each pixel can be enhanced.

Embodiment 4

In the above-mentioned embodiments, the optical reflection film LRL is configured so as to be formed on the side wall surfaces of the openings formed in the bank film BNK and on the surface of the bank film BNK. However, it is needless to say that the present invention is not limited to such constitutions, and the optical reflection film LRL may be formed only on the side wall surfaces of the openings formed in the bank film BNK. This is because, when the light from the light emitting material layer FLR enters the inside of the bank film BNK, the major portion of the light is constituted by the light which enters through the side wall surface of the openings formed in the bank film BNK.

Embodiment 5

In the above-mentioned embodiments, the light reflection film LRL is formed on the upper surface of the bank film BNK. However, the present invention is not limited to such a constitution, and a light absorption film may be formed on the upper surface of the bank film BNK. This light absorption film is a film which causes the light absorption film to absorb light from the light emitting material layer FLR. The light absorption film may be constituted of a film which contains a black pigment or the like, for example. In view of the this, when a light absorption function is imparted to the bank film BNK per se, the light absorption film need not be provided to the bank film BNK.

The above-mentioned respective embodiments may be used in a single form or in combination. This is because the advantageous effects of the respective embodiments can be obtained in a single form or synergistically.

As can be clearly understood from the above explanation, according to the organic EL display device of the present invention, the light take-out efficiency can be enhanced.

What we claim is:

1. An organic EL display device, having a plurality of pixel regions which are partitioned from one another, is characterized in that:
   at least one electrode, a light emitting material layer and another electrode are stacked on each pixel region formed on a surface of a substrate,
   the light emitting material layer is formed in a state such that the light emitting material layer is filled in the inside of an opening portion formed in a partition which partitions the pixel region and other pixel regions arranged close to the pixel region, and
   a light reflection material is imparted to at least a side wall surface of the opening portion of the partition.

2. An organic EL display device, having a plurality of pixel regions which are partitioned from one another, is characterized in that:
   at least one electrode, a light emitting material layer and another electrode are stacked on each pixel region formed on a surface of a substrate,
   the light emitting material layer is formed in a state such that the light emitting material layer is filled in the inside of an opening portion formed in a partition which partitions the pixel region and other pixel regions arranged close to the pixel region, and
   a material layer having an optical refractive index which differs from an optical refractive index of a material of the partition is formed on at least a side wall surface of the opening portion of the partition.

3. An organic EL display device according to claim 2, wherein the material layer having the optical refractive index which differs from the optical refractive index of the material of the partition has the optical refractive index thereof set larger than the optical refractive index of the partition.

4. An organic EL display device, having a plurality of pixel regions which are partitioned from one another, is characterized in that:
   at least one electrode, a light emitting material layer and another electrode are stacked on each pixel region formed on a surface of a substrate,
   the light emitting material layer is formed in a state such that the light emitting material layer is filled in the inside of an opening portion formed in a partition which partitions the pixel region and other pixel regions arranged close to the pixel region, and
   a light reflection material is imparted to at least a side wall surface of the opening portion of the partition and a pigment which decreases an optical transmissivity of the partition is contained in the partition.

* * * * *